(12) United States Patent
Choi et al.

(10) Patent No.: US 7,081,651 B2
(45) Date of Patent: Jul. 25, 2006

(54) NON-VOLATILE MEMORY DEVICE WITH PROTRUDING CHARGE STORAGE LAYER AND METHOD OF FABRICATING THE SAME

(75) Inventors: Jung-Dal Choi, Kyunggi-do (KR); Jong-Woo Park, Seoul (KR); Seong-Soon Cho, Kyunggi-do (KR); Chang-Hyun Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 323 days.

(21) Appl. No.: 10/186,153

(22) Filed: Jun. 27, 2002

(65) Prior Publication Data
US 2003/0001196 A1    Jan. 2, 2003

(30) Foreign Application Priority Data
Jun. 28, 2001    (KR) ................................ 2001-37420

(51) Int. Cl.
*H01L 29/792* (2006.01)
(52) U.S. Cl. ................ 257/324; 257/314; 257/E29.309
(58) Field of Classification Search ................ 257/324, 257/390, 314, 315, 316, 317, 318, 319, 320, 257/321, 322, 323, 325, 326, 391, 392
See application file for complete search history.

(56) References Cited

U.S. PATENT DOCUMENTS

| | | |
|---|---|---|
| 3,590,272 A | 6/1971 | Laurel |
| 4,264,376 A | 4/1981 | Yatsuda et al. |

(Continued)

FOREIGN PATENT DOCUMENTS

EP    0597124 A1    5/1994

(Continued)

OTHER PUBLICATIONS

Streetman, " Solid State Electronic Devices," 1990, Prentice Hall, 3rd ed., p. 325-327.*

(Continued)

*Primary Examiner*—Nathan J. Flynn
*Assistant Examiner*—Kevin Quinto
(74) *Attorney, Agent, or Firm*—Marger Johnson & McCollom, P.C.

(57) ABSTRACT

A non-volatile memory device includes a tunnel oxide layer, a charge storage layer, a blocking insulating layer, and a gate electrode that are sequentially stacked, as well as an impurity diffusion layer in an active region at both sides of the gate electrode. The gate electrode crosses active regions between device isolation layers formed in a predetermined area of a semiconductor substrate, and an edge of the charge storage layer is extended to have a protruding part that protrudes from the gate electrode. In order to form a charge storage layer having a protruding part, a stack insulating layer including first to third insulating layers is formed in an active region between the device isolation layers formed in the substrate. A plurality of gate electrodes crossing the active region are formed on the stack insulating layer, and a sidewall spacer is formed on both sidewalls of the gate electrode. Using the sidewall spacer and the gate electrode, the stack insulating layer is etched to form a charge storage layer that protrudes from the sidewall of the gate electrode.

35 Claims, 18 Drawing Sheets

U.S. PATENT DOCUMENTS

| | | | |
|---|---|---|---|
| 4,722,910 A * | 2/1988 | Yasaitis |
| 5,349,221 A * | 9/1994 | Shimoji |
| 5,424,569 A * | 6/1995 | Prall |
| 5,496,753 A * | 3/1996 | Sakurai et al. |
| 5,872,382 A * | 2/1999 | Schwalke et al. |
| 6,211,047 B1 * | 4/2001 | Lee et al. |
| 6,326,268 B1 * | 12/2001 | Park et al. |
| 6,399,466 B1 * | 6/2002 | Nakamura |
| 6,458,661 B1 * | 10/2002 | Sung |
| 6,465,837 B1 * | 10/2002 | Wu |
| 6,468,865 B1 * | 10/2002 | Yang et al. |

FOREIGN PATENT DOCUMENTS

| | | | |
|---|---|---|---|
| JP | 7-297301 | * 11/1995 |

OTHER PUBLICATIONS

Wolf, "Silicon Processing for the VLSI Era, vol. 2—Process Integration," 1990, Lattice Press, p. 12-13.*

* cited by examiner

NON-VOLATILE MEMORY DEVICE WITH PROTRUDING CHARGE STORAGE LAYER AND METHOD OF FABRICATING THE SAME

RELATED APPLICATION

This application relies for priority upon Korean Patent Application No. 2001-37420, filed on Jun. 28, 2001, the contents of which are herein incorporated by this reference in their entirety.

FIELD OF THE INVENTION

The present invention generally relates to a method of fabricating a semiconductor device. More specifically, the present invention is directed to a floating trap-type non-volatile memory device that stores data in a charge storage layer including one insulating layer by injecting charges, and to a method of fabricating the same.

BACKGROUND OF THE INVENTION

Non-volatile memory devices continuously hold data even when an external power is turned off. As the integration density of memory devices increases, there is a need for reducing the area and vertical height of a memory cell. Since a conventional floating gate type non-volatile memory device has a floating gate, it is restrictive to reduce a vertical height of a memory cell. For that reason, a floating trap-type non-volatile memory device has been attractive as a candidate to overcome the above disadvantage in that charges can be stored in at least one insulating layer without a floating gate.

FIG. 1 is a top plan view of a conventional floating trap-type non-volatile memory device. A device isolation layer 11 is formed in a predetermined area of a semiconductor substrate to define an active region 13. A plurality of gate electrodes 30 cross the active region, and a charge storage layer 24 is intervened between the gate electrode 30 and the active region 13. A sidewall spacer 36 is formed on a sidewall of the gate electrode 30.

FIG. 2 through FIG. 5 are cross-sectional flow diagrams showing the steps of fabricating a conventional non-volatile memory device, taken along a line I–I' of FIG. 1.

Referring now to FIG. 2, a device isolation layer 11 is formed in a predetermined area of a semiconductor substrate to define active regions 13. A stack insulating layer 18 and a gate conductive layer 20 are formed on a semiconductor substrate where the device isolation layer 11 is formed. Generally, the stack insulating layer 18 includes first, second, and third insulating layers 12, 14, and 16 which are conventionally made of thin thermal oxide, silicon nitride, and CVD oxide, respectively.

Referring now to FIG. 3, the gate conductive layer 20 and the stack insulating layer 18 are sequentially patterned to form a plurality of gate electrodes 30 crossing the device isolation layer 11. A tunnel oxide layer 22, a charge storage layer 24, and a blocking insulating layer 26 are sequentially stacked between the gate electrode 30 and the active region 13. In case sidewalls of the tunnel oxide layer 22, the charge storage layer 24, and the blocking insulating layer 26 are damaged by an etch, a defect density increases with increased trap density around edges of the tunnel oxide layer 22 and the blocking insulating layer 26. As a result, it is likely to generate a trap-assisted leakage current to the gate electrode 30 and the semiconductor substrate 10 through the high-density trap.

Referring now to FIG. 4, a thermal oxidation process is carried out for the semiconductor substrate in order to alleviate the damage of the sidewalls of the blocking insulating layer 26 and the gate electrode 30. As a result, a capping insulating layer 32 is formed on a sidewall and a top surface of the gate electrode 30.

Referring now to FIG. 5, using the gate electrode 30 and the capping insulating layer 32 as an ion implanting mask, impurities are implanted into the semiconductor substrate to form an impurity diffusion layer 34. A sidewall spacer 36 is then formed on sidewalls of the charge storage layer 24, the blocking insulating layer 26, and the capping insulating layer 32 that are sequentially stacked. As illustrated in FIG. 4 and FIG. 5, oxygen atoms are diffused through an interface between the semiconductor substrate 10 and the tunnel oxide layer 22 during the thermal oxidation process. At this time, an edge of the tunnel oxide layer 22 becomes thick (i.e., a bird's beak phenomenon occurs) because it is oxidized by the diffused oxygen atoms. This leads to a drop in device operational speed. Furthermore, a trap density becomes high at the relatively thicker edge of the tunneling oxide layer 22 thereby increasing trap-assisted leakage current through the edge. As the bird's beak phenomenon causes a thickness variation of a tunnel oxide layer to be high in a cell array, device characteristics become non-uniform. The more a gate line width decreases, the more the thickness of the tunnel oxide layer 22 increases. Therefore, what is needed is a non-volatile memory device with a structure to overcome device operational characteristic defects that result from a tunnel oxide layer of high trap density and from bird's beak phenomenon.

SUMMARY OF THE INVENTION

A feature of the present invention is to provide a non-volatile memory device having a conformal tunnel oxide layer without a bird's beak phenomenon, and to provide a method of fabricating the same.

Another feature of the present invention is to provide a non-volatile memory device that can minimize the influence of trap-assisted tunneling, and to provide a method of fabricating the same.

According to an aspect of the present invention, a non-volatile memory device includes a charge storage layer and a gate electrode. The gate electrode crosses an active region between device isolation layers formed in a semiconductor substrate. The charge storage layer intervenes between the gate electrode and the active region. An edge of the charge storage layer extends to form a protruding part that protrudes from a sidewall of the gate electrode.

In a preferred embodiment of the present invention, the charge storage layer is isolated by the device isolation layer or is successive under the gate electrode. A blocking insulating layer intervenes between the gate electrode and the charge storage layer, and a tunnel oxide layer intervenes between the charge storage layer and the active region. The non-volatile memory device further includes a first sidewall spacer on both sidewalls of the gate electrode. The width of the charge storage layer is preferably approximately equal to the sum of a width of the gate electrode and widths of the first sidewall spacers. Further, the nonvolatile memory device may include a second sidewall spacer that covers a sidewall of the charge storage layer and the first sidewall spacer. A gate capping insulating layer may intervene between the sidewall of the gate electrode and the sidewall spacer.

The non-volatile memory device has a cell array region and a peripheral circuit region. A first transistor including a wordline and a stack insulating layer is formed on an active region. The stack insulating layer comprises a tunnel oxide layer, a charge storage layer, and a blocking insulating layer and a first transistor. A second transistor including at least a gate insulating layer and a gate electrode is formed in the peripheral region. The first sidewall spacer may be formed on each sidewall of the gate electrodes in the first and second transistors. Further, a second sidewall spacer may be formed on the first sidewall spacer that is formed on each sidewall of the wordline and the gate electrode.

According to another aspect of the present invention, a method of fabricating a nonvolatile memory device is provided. A stack insulating layer is formed on an active region of a semiconductor substrate. The stack insulating layer comprises at least first, second, and third insulating layers that are sequentially stacked. A plurality of gate electrodes crossing the active region are formed on a semiconductor substrate including the stack insulating layer. The stack insulating layer is patterned to form a tunnel oxide layer, a charge storage layer, and a blocking insulating layer that are sequentially stacked between the gate electrode and the active region. The tunneling oxide layer, the charge storage layer, and the blocking insulating layer correspond to the first, second, and third insulating layers, respectively. An edge of the charge storage layer has a protruding part that protrudes from a sidewall of the gate electrode.

Specifically, the device isolation layer may be formed using a conventional trench isolation technology. In this case, the stack insulating layer is formed on an overall surface of a semiconductor substrate where the device isolation layer is formed. A gate conductive layer is formed on the stack insulating layer, and then is patterned to form a gate electrode crossing the active region. Alternatively, the device isolation layer may be formed using a self-aligned trench isolation technology. In this case, a stack insulating layer and a lower gate conductive layer are sequentially formed on an active region between the device isolation layers. An upper gate conductive layer is formed on an overall surface of a semiconductor substrate where the device isolation layer is formed. Thereafter, the upper and lower gate conductive layers are sequentially patterned to form the active region crossing the active region.

In a preferred embodiment of the present invention, a first sidewall spacer is formed on a sidewall of the gate electrode so as to form the protruding part of the charge storage layer. Using the first sidewall spacer and the gate electrode as an etch mask, at least the third and second insulating layers are etched to form a blocking insulating layer protruding from the sidewall of the gate electrode and a charge storage layer. Alternatively, prior to formation of the first sidewall spacer, the third insulating layer exposed to both sides of the gate electrode may be removed. In this case, the charge storage layer has a protruding part that protrudes from the sidewall of the gate electrode, and the first sidewall spacer covers the sidewall of the gate electrode and an upper portion of the protruding part. Further, a second sidewall spacer may be formed to cover sidewalls of the charge storage layer and the first sidewall spacer.

DESCRIPTION OF THE PREFERRED EMBODIMENT

Figure 1:
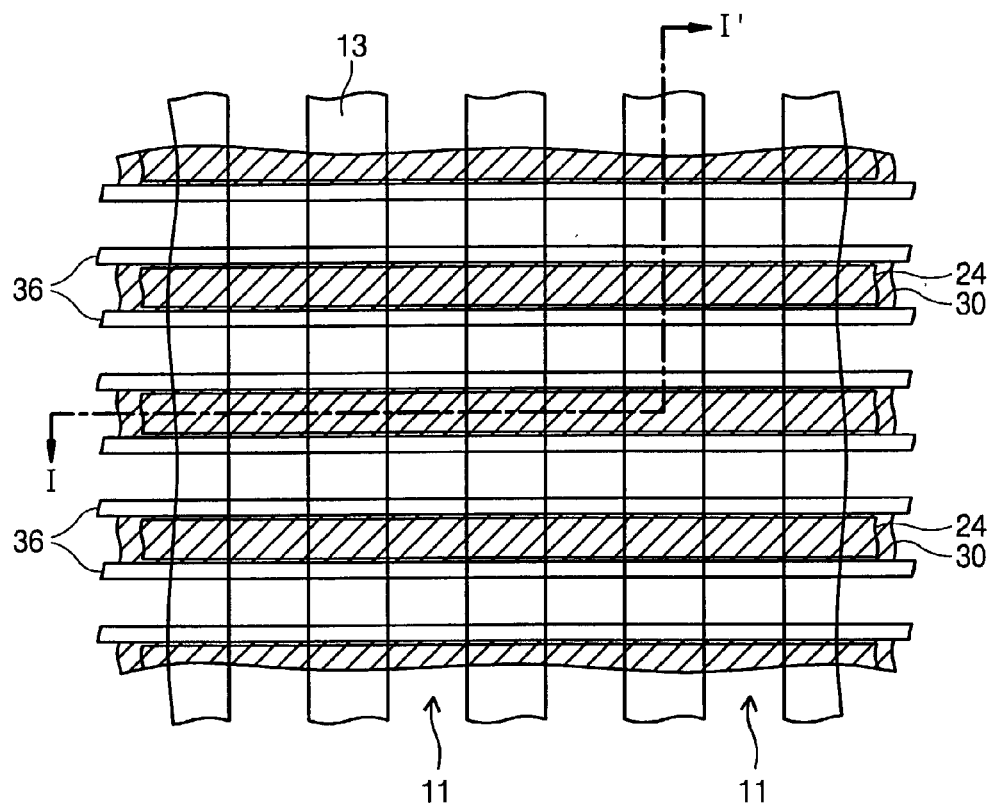
FIG. 1 is a top plan view of a conventional non-volatile memory device.
Figure 2:
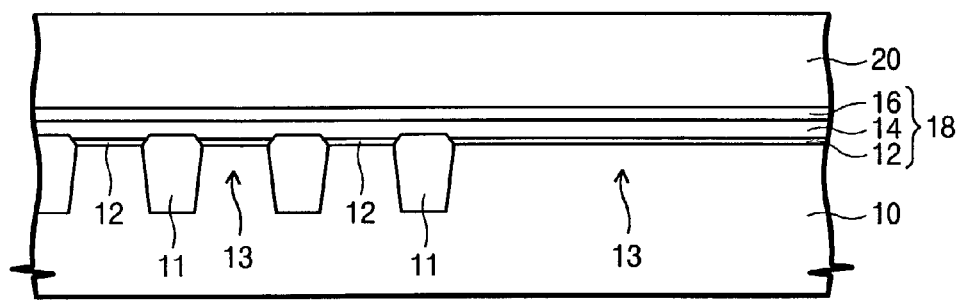
FIG. 2 through FIG. 5 are cross-sectional flow diagrams showing the steps of fabricating the conventional non-volatile memory device, taken along a line I–I' of FIG. 1.
Figure 3:
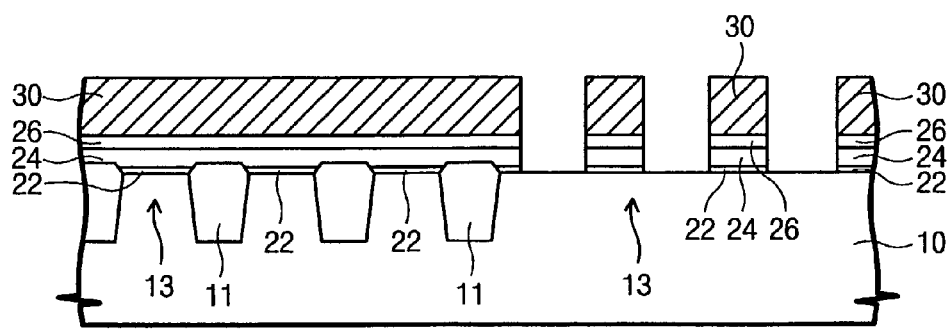
Figure 4:
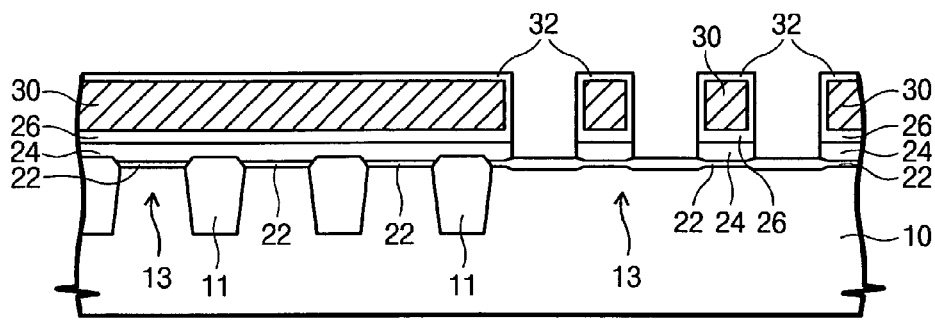
Figure 5:
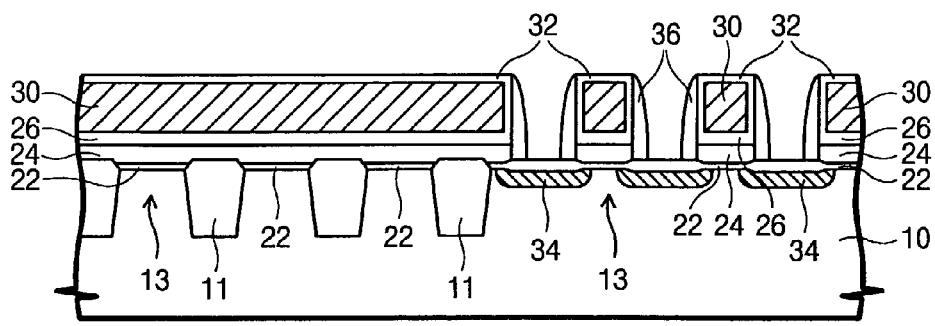

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 6:
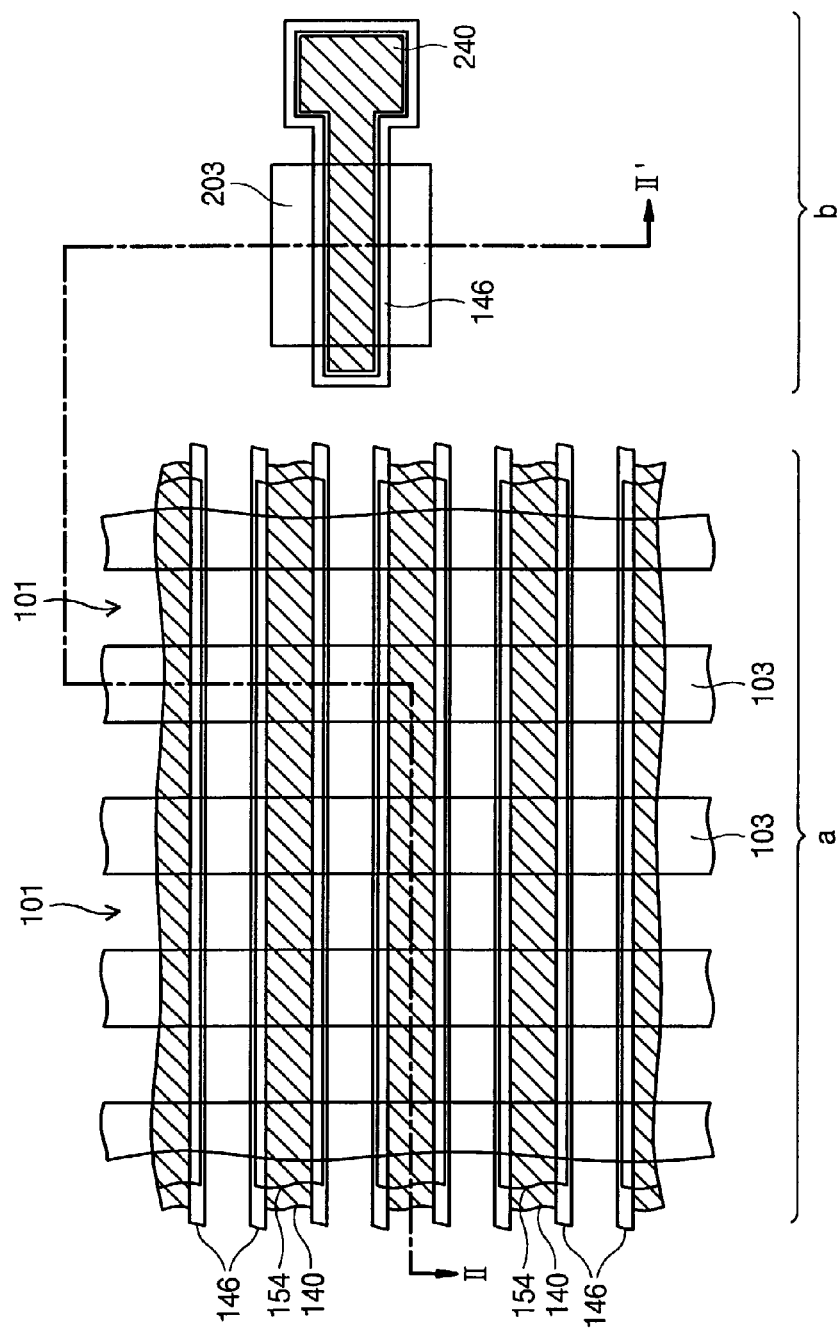
FIG. 6 is a top plan view of a non-volatile memory device according to first and second embodiments of the present invention.
Figure 7:
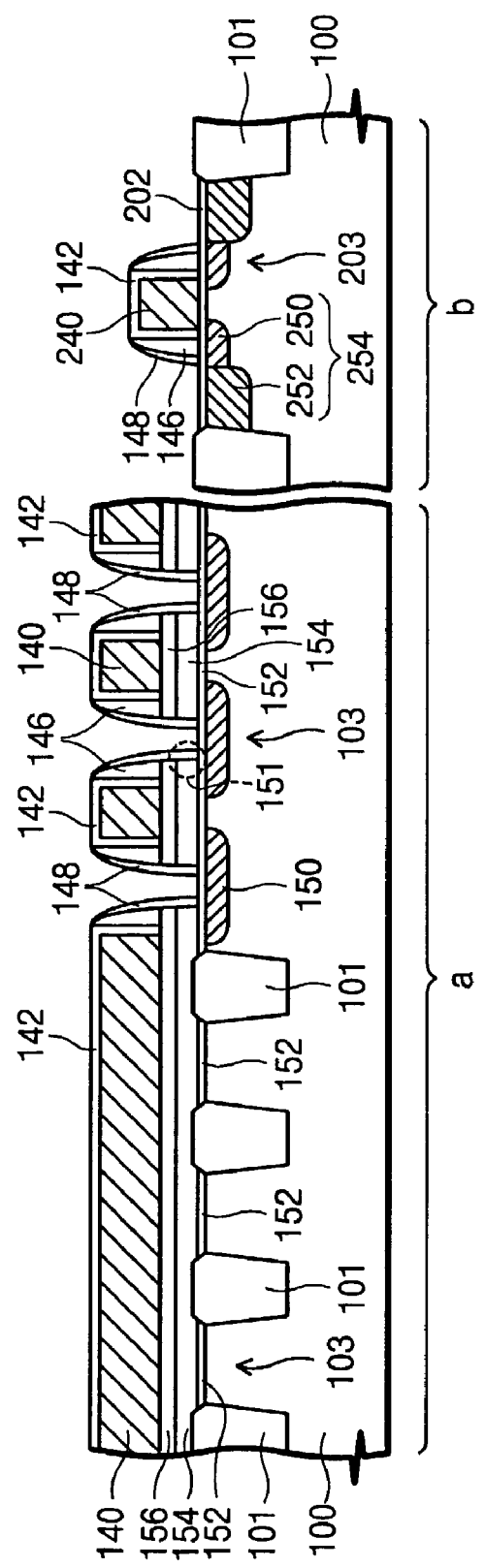
FIG. 7 is a cross-sectional view of the non-volatile memory device according to the first embodiment, taken along a line II–II of FIG. 6.

FIG. 6 is a top plan view illustrating a non-volatile memory device according to first and second embodiments of the present invention, in which a region "a" is a cell array region and a region "b" is a peripheral circuit region. FIG. 7 is a cross-sectional view illustrating the non-volatile memory device according to the first embodiment, taken along a line II–II of FIG. 6.

Referring now to FIG. 6 and FIG. 7, a device isolation layer 101 is formed in a predetermined region of a semiconductor substrate 100. The device isolation layer 101 defines a plurality of first active regions 103 in the cell array region "a", and a second active region 203 in the peripheral circuit region "b". A plurality of wordlines 140 crossing over the first active regions 103 and the device isolation layer 101 are formed in the cell array region "a". A stack insulating layer intervenes between the wordlines 140 and the first active regions 103, and includes a tunnel oxide layer 152, a charge storage layer 154, and a blocking insulating layer 156 that are sequentially stacked. It is preferable that the tunnel oxide layer 154, the charge storage layer 154, and the blocking insulating layer 156 are made of thermal oxide, silicon nitride, and CVD oxide, respectively. Also, the blocking insulating layer 156 and the charge storage layer 154 overlap with the wordline 140 to cross over the first active region 103 and the device isolation layer 101. A sidewall of the wordline 140 is covered with a first sidewall spacer.

Furthermore, a gate capping oxide layer 142 may intervene between the wordline 140 and the first sidewall spacer 146. A width of the charge storage layer 154 is larger than that of the wordline 140 at least, so that the blocking insulating layer 156 has a protruding part 151 protruding from a sidewall of the wordline 140. Therefore, although a high electric field is applied between the wordline 140 and the first active regions 103 by a program voltage or an erase voltage, an electric field applied to the protruding part 151 is relatively weak. This causes a conspicuous decrease in a leakage current flowing through a blocking insulating layer 156 and a tunnel oxide layer 152 that are located over and under the protruding part 151, respectively. As a result, a soft program characteristic or a data retention characteristic can be improved.

The first sidewall spacer 146 covers not only the sidewall of the wordline 140 but also a top of the protruding part 151. The second sidewall spacer 146 may cover an outer sidewall of the first sidewall spacer 148 and a sidewall of the charge storage layer 154. A first impurity diffusion layer 150 is formed in the first active region 103 between the wordlines 140. Therefore, a first cell transistor is formed at an intersection of the wordline 140 and the first active region 103. In this case, the tunnel oxide layer 152 under the wordline 140 has a uniform thickness. That is, a thick tunnel oxide layer caused by a bird's beak phenomenon is not formed at least under an edge of the wordline 140. Thus, a plurality of first transistors in the cell array region "a" have the equivalent threshold voltage.

A gate electrode 240 crossing over the second active region 203 is formed in the peripheral circuit region "b". The first sidewall spacer 146 covers the gate insulating layer 202 between the gate electrode 240 and the second active region 203, and a sidewall of the gate electrode 240. The second sidewall spacer may cover an outer sidewall of the first sidewall spacer 146. A gate capping layer 142 may intervene between the fist sidewall spacer 142 and the gate electrode 240. A dual-structured impurity diffusion layer 254 is formed in the second active region 203 at both sides of the gate electrode 240. The dual-structured impurity diffusion layer 254 includes a second impurity diffusion layer 250 and a third impurity diffusion layer 252 that correspond to a lightly doped impurity diffusion layer and a heavily doped impurity diffusion layer, respectively.

FIG. 8 through FIG. 11 are cross-sectional flow diagrams showing the steps of fabricating a non-volatile memory device according to a first embodiment of the present invention, taken along a line II–II of FIG. 6.

Figure 8:
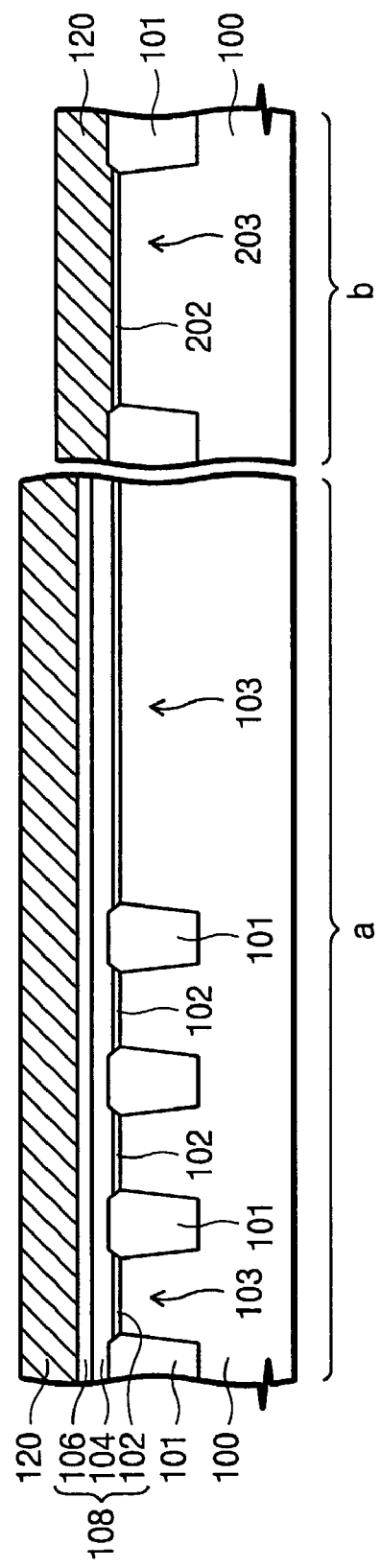
FIG. 8 through FIG. 11 are cross-sectional flow diagrams showing the steps of fabricating the non-volatile memory device according to the first embodiment, taken along the line II–II of FIG. 6.

Referring now to FIG. 8, a device isolation layer 101 is formed in a semiconductor substrate 100 to define a first active region 103 and a second active region 203 in a cell array region "a" and a peripheral circuit region "b", respectively. A stacking insulating layer 108 and a gate conductive layer 120 are sequentially formed in a cell array region "a" of a semiconductor substrate 100 where the device isolation layer 101 is formed. At the same time, a gate insulating layer 108 and a gate conductive layer 120 are sequentially formed in a peripheral region "b" of the semiconductor substrate where the device isolation layer 101 is formed. Preferably, the stack insulating layer 108 is formed by sequentially stacking first, second, and third insulating layers 102, 104, and 106. Preferably, the first insulating layer 102 is made of thermal oxide. Preferably, the first insulating layer has a thickness of approximately 15 Å–35 Å in order to lower a program and erase voltages. In this embodiment, it is preferable that the second insulating layer 104 has a thickness of approximately 40 Å–100 Å, and the third insulating layer 106 has a thickness of approximately 40 Å–120 Å. The gate conductive layer 120 may be made of polysilicon, or polycide that is formed by sequentially stacking polysilicon and metal silicide.

Figure 9:
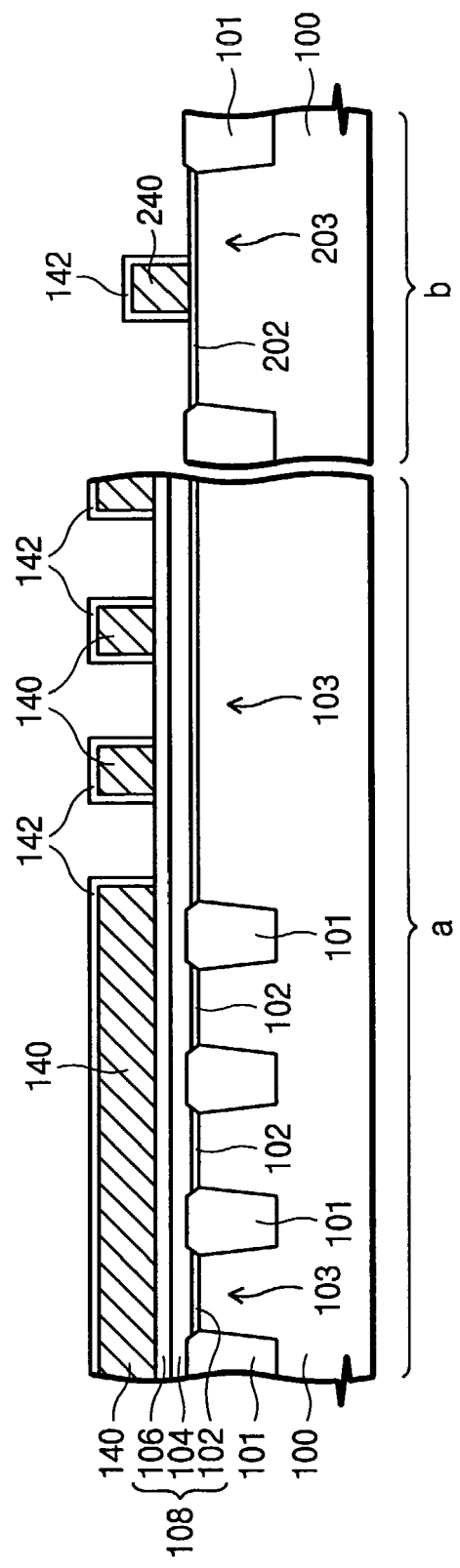

Referring now to FIG. 9, the gate conductive layer 120 is patterned to form a plurality of wordlines 140 crossing the first active regions 103 in the cell array region "a", and to form a gate electrode 240 at least on the second active region 203 in the peripheral circuit region "b". The third insulating layer 106 exposed between the wordlines 140 is overetched or attacked by plasma while etching the gate conductive layer 120. Therefore, a defect site may be created in the third insulating layer around an edge of the wordline 140. Subsequently, a trap-to-trap tunneling may occur through the defect site. Charges stored in a later-formed charge storage layer are then discharged to a gate electrode, having an undesirable influence on device operations. Preferably, in order to overcome the above disadvantages, a thermal oxidation process is performed for a semiconductor substrate where the wordline 140 and the gate electrode 240 are formed. Thus, the damage of the third insulating layer 106 can be alleviated. As a result, a gate capping oxide layer 142 is formed on sidewalls and top surfaces of the wordline 140 and the gate electrode 240.

Figure 10:
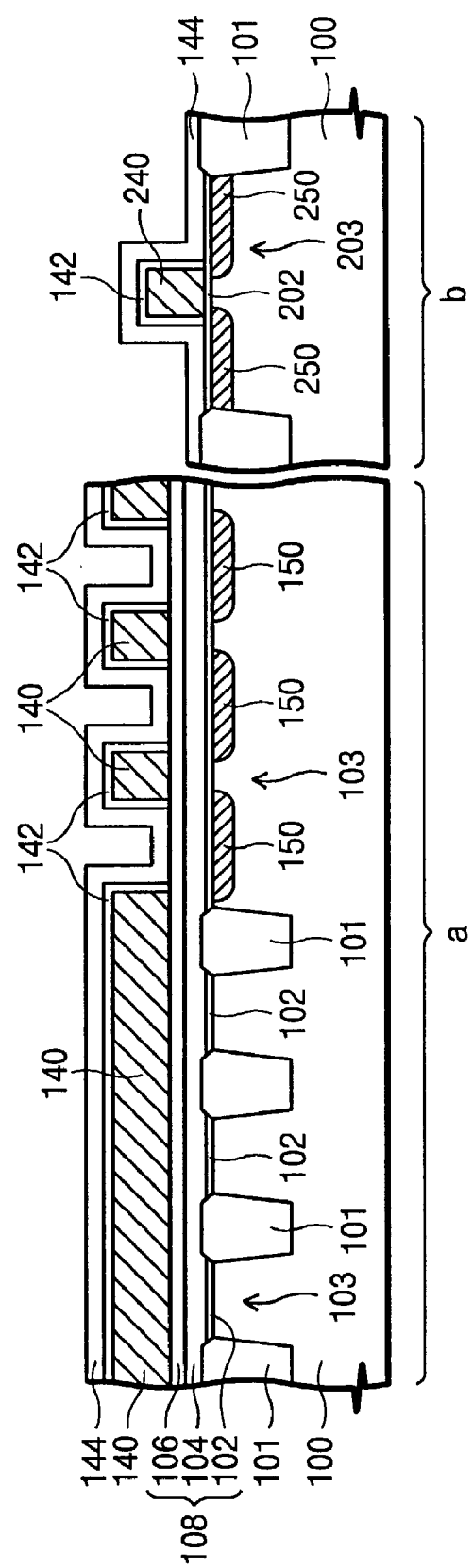

Referring now to FIG. 10, impurities are implanted into the first active region 103 between the wordlines 140 to form a first impurity diffusion layer 150. Also, impurities are implanted into the second active region 203 at both sides of the gate electrode 240 to form a second impurity diffusion layer 250. Alternatively, the first and second impurity diffusion layers 150 and 250 may be formed at the same time or prior to formation of the gate capping oxide layer 142. Thereafter, a spacer insulating layer 144 is conformally formed on an entire surface of the resultant structure in which the first and second impurity diffusion layers 150 and 250 are formed. Preferably, the spacer insulating layer 144 is made of silicon nitride or oxide.

Figure 11:
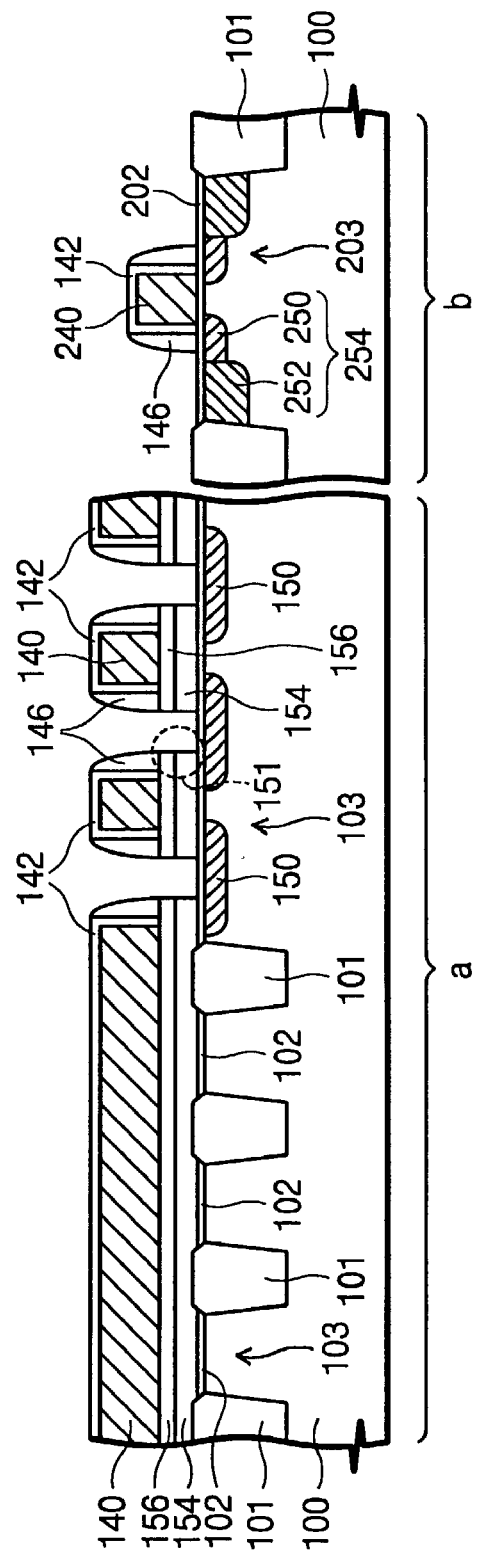

Referring now to FIG. 11, the spacer insulating layer 144 is anisotropically etched to form a first sidewall spacer 146 on sidewalls of the wordline 140 and the gate electrode 240. If the spacer insulating layer 144 is made of oxide, the third insulating layer 106 is also etched during the anisotropic etch to expose the second insulating layer 104. If the spacer insulating layer 144 is made of silicon nitride, the third insulating layer 106 is etched using the wordline 140 and the first sidewall spacer 146 as an etch mask following formation of the first sidewall spacer 146.

Using the first sidewall spacer 146 and the gate electrode 140 as an etch mask, at least the second insulating layer 108 is then etched to form at least second and third insulating layer patterns 154 and 156 between the wordline 140 and the first active region 103. Edges of the second and the third insulating layer patterns 154 and 156 are extended to form a protruding part 151 that protrudes from both sides of the wordline 140. The second insulating layer patterns 154 correspond to a charge storage layer, and the third insulating layer pattern 156 intervened between the wordline 140 and the second insulating layer 154 corresponds to a blocking insulating layer. The first insulating layer 102 under the wordline 140 corresponds to the tunnel oxide layer 152 illustrated in FIG. 7.

Following formation of the first sidewall spacer 146, impurities are implanted into the second active region exposed to both sides of the gate electrode 240 in the peripheral circuit region "b" to form a third impurity diffusion layer 252. Subsequently, a dual-structured impurity diffusion layer 254 is formed in the second active region at both sides of the gate electrode 240. The third impurity diffusion layer 252 may be formed before or after formation of the second insulating layer pattern 154.

Following formation of the third and the second insulating layer patterns 156 and 154, a second sidewall spacer 148 (see FIG. 7) may further be formed in the cell array region "a" and the peripheral circuit region "b". In the cell array region "b", the second sidewall spacer 148 covers sidewalls of the first sidewall spacer 146, the third insulating layer pattern 156, and the second insulating layer pattern 154. In the peripheral circuit region "b", the second sidewall spacer 148 covers the first sidewall spacer 146. If the second sidewall spacer 148 is further formed, the third impurity diffusion layer 252 may be formed in the second active region 203 exposed to both sides of the gate electrode 240 following formation of the second sidewall spacer 148. Alternatively, the first and second impurity diffusion layers 150 and 250 may be formed following the formation of the first sidewall spacer 146, and the third impurity diffusion layer 252 may be formed following the formation of the second sidewall spacer 148.

As a result, a width of the charge storage layer 154 is equal to the sum of the width of the wordline 140 and the widths of the sidewall spacers 146. In other words, the non-volatile memory device of the invention has a protruding part that is formed by extending an edge of the charge storage layer 154 to protrude from a sidewall of the wordline 140. Therefore, even if defect sites are created in insulating layers over/under the protruding part, device operation characteristics are scarcely influenced by the defect sites compared with a prior art. Because an edge of the tunnel oxide layer 152 also protrudes from the wordline 140 wherein a bird's beak phenomenon may occur in subsequent annealing processes, the non-volatile memory device of the invention has an excellent data retention characteristic compared with the prior art.

Figure 12:
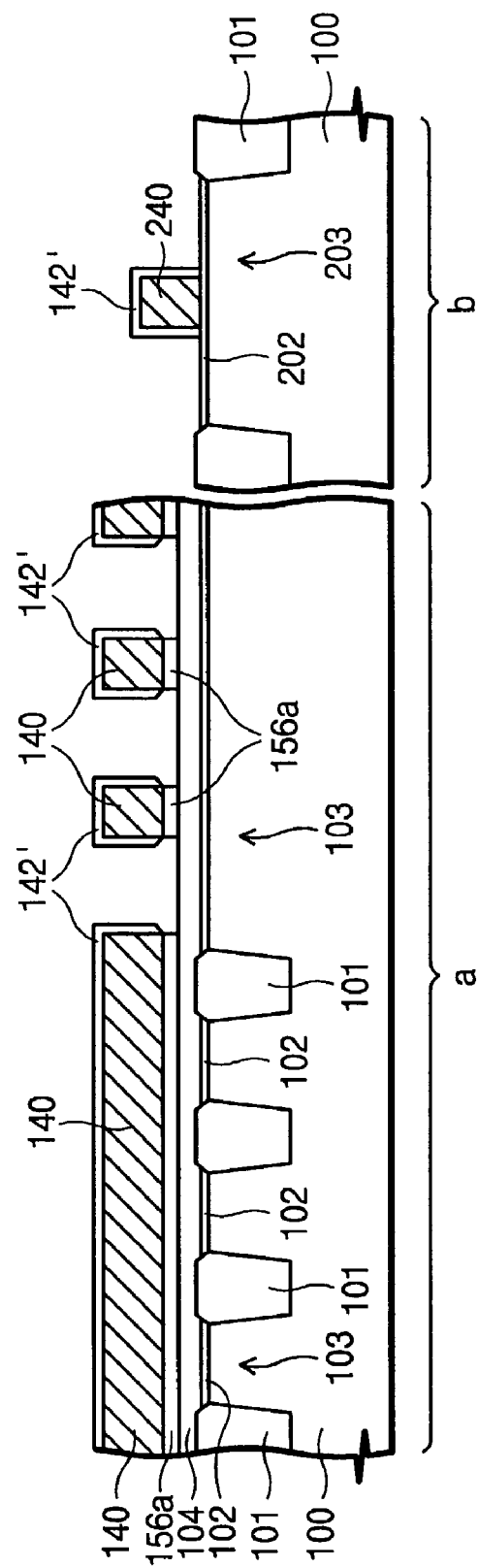
FIG. 12 through FIG. 14 are cross-sectional flow diagrams showing the steps of fabricating the non-volatile memory device according to the second embodiment, taken along the line II–II of FIG. 6.
Figure 13:
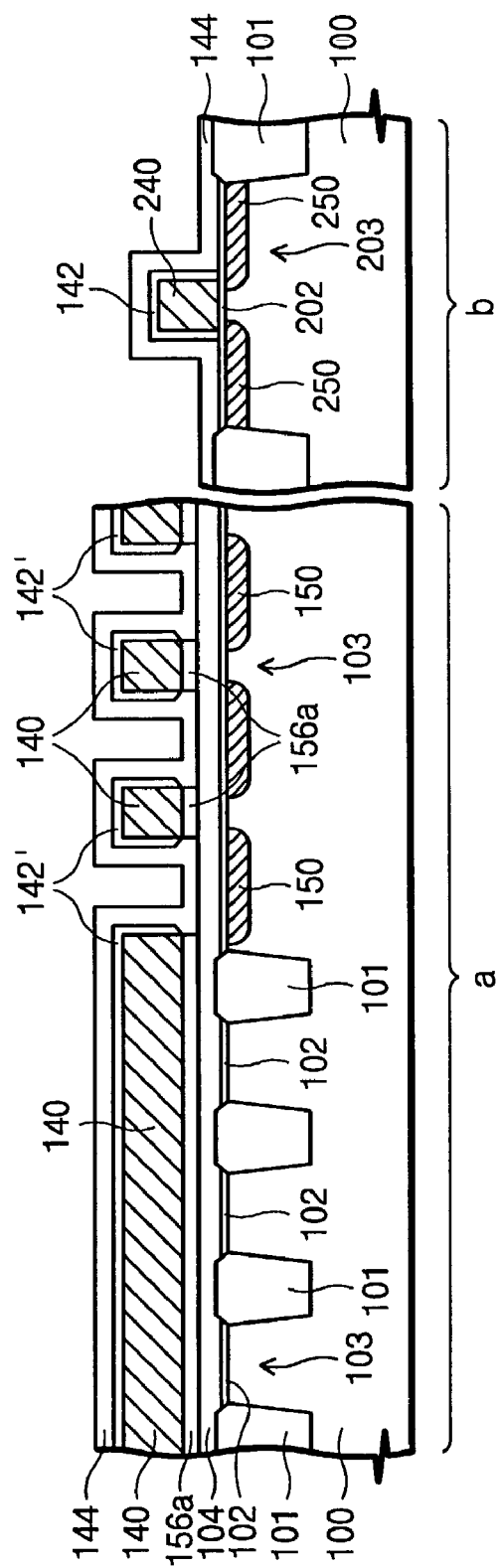
Figure 14:
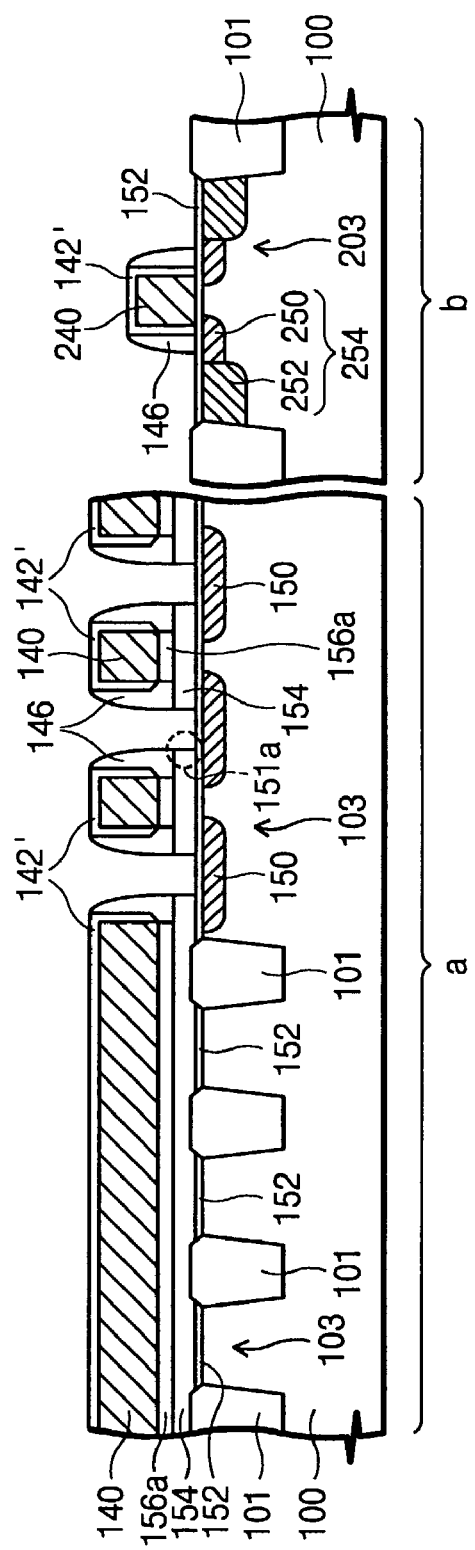

FIG. 12 through FIG. 14 are cross-sectional flow diagrams for explaining the steps of fabricating a non-volatile memory device according to a second embodiment of the present invention.

Referring now to FIG. 12, steps until formation of a gate conductive layer 120 (see FIG. 8) in the second embodiment are identical to those in the first embodiment, as described in FIG. 8. The gate conductive layer 120 and the third insulating layer 106 (see FIG. 8) are sequentially patterned to form a wordline 140 and a third insulating layer pattern 156a on the second insulating layer 104 in the cell array region "a" and to form a gate electrode 240 in the peripheral circuit region "b". The third insulating layer pattern 156 corresponds to a blocking insulating layer. Furthermore, a thermal oxidation process is carried out for the semiconductor substrate to form a gate capping oxide layer 142' on a sidewall and a top surface of the wordline 140 and the gate electrode 240.

Referring now to FIG. 13, in the cell array region "a", impurities are implanted into a first active region 103 between the wordlines 140 to form a first impurity diffusion layer 150. In the peripheral circuit region "b", impurities are implanted into a second active region 203 exposed to both sides of the gate electrode 240 to form a second impurity diffusion layer 250. A spacer insulating layer 144 is conformally formed on an entire surface of a semiconductor substrate 100 where the wordline 140 and gate electrode 240 are formed. The spacer insulating layer 144 is made of silicon nitride or oxide.

Referring now to FIG. 14, the spacer insulating layer 144 is anisotropically etched to form a first sidewall spacer 146 on sidewalls of the wordline 140 and the gate electrode 240. If the spacer insulating layer 144 is made of silicon nitride, the second insulating layer 104 is also etched to form the first sidewall spacer 146 and a second insulating layer pattern 154 with a protruding part 151a protruding from the sidewall of the wordline 140 while anisotropically etching the spacer insulating layer 144.

If the spacer insulating layer 144 is made of oxide, it is anisotropically etched to form a first sidewall spacer 146 on the sidewall of the wordline 140. Using the first sidewall spacer 146 and the wordline 140 as an etch mask, the second insulating layer 104 is then etched to form a second insulating layer pattern 154 with a protruding part 151 a protruding from the sidewall of the wordline 140. The second insulating layer pattern 154 corresponds to a charge storage layer. Following formation of the first sidewall spacer 146, impurities are implanted into the second active region 203 at both sides of the gate electrode 240 to form a third impurity diffusion layer 252. As a result, a dual-structured impurity diffusion layer 254 is formed in the second active region 203 at both sides of the gate electrode 240. The third impurity diffusion layer 252 may be formed after or before formation of the second insulating layer pattern 154.

Following formation of the second insulating layer pattern 154, a second sidewall spacer 148 (see FIG. 7) may further be formed in the cell array region "a" and the peripheral circuit region "b". In the cell array region "a", the second sidewall spacer 148 of FIG. 7 covers the first sidewall spacer 146 and the sidewalls of the third and second insulating layer pattern 156a and 154. In the peripheral circuit region "b", the second sidewall spacer 148 of FIG. 7 covers the first sidewall spacer 146. In this case, the third impurity diffusion layer 252 may be formed in the second active region 203 at both sides of the gate electrode 240 following formation of the second sidewall spacer 148. Alternatively, the first and second impurity diffusion layers 150 and 250 may be formed following formation of the first sidewall spacer 146, and the third impurity diffusion layer 252 may be formed following the formation of the second sidewall spacer 148.

As illustrated in the drawings, constructions of the non-volatile memory devices according to the first and second embodiments are very similar to each other. A difference therebetween is that the third insulating layer pattern 156a is self-aligned to the wordline 140, and thus a width of the third insulating layer pattern 156a is identical to a width of the wordline 140. Therefore, the first sidewall spacer 146 covers a sidewall of the wordline 140, a sidewall of the third insulating layer 156a, and a top surface of the protruding part 151a.

Figure 15:
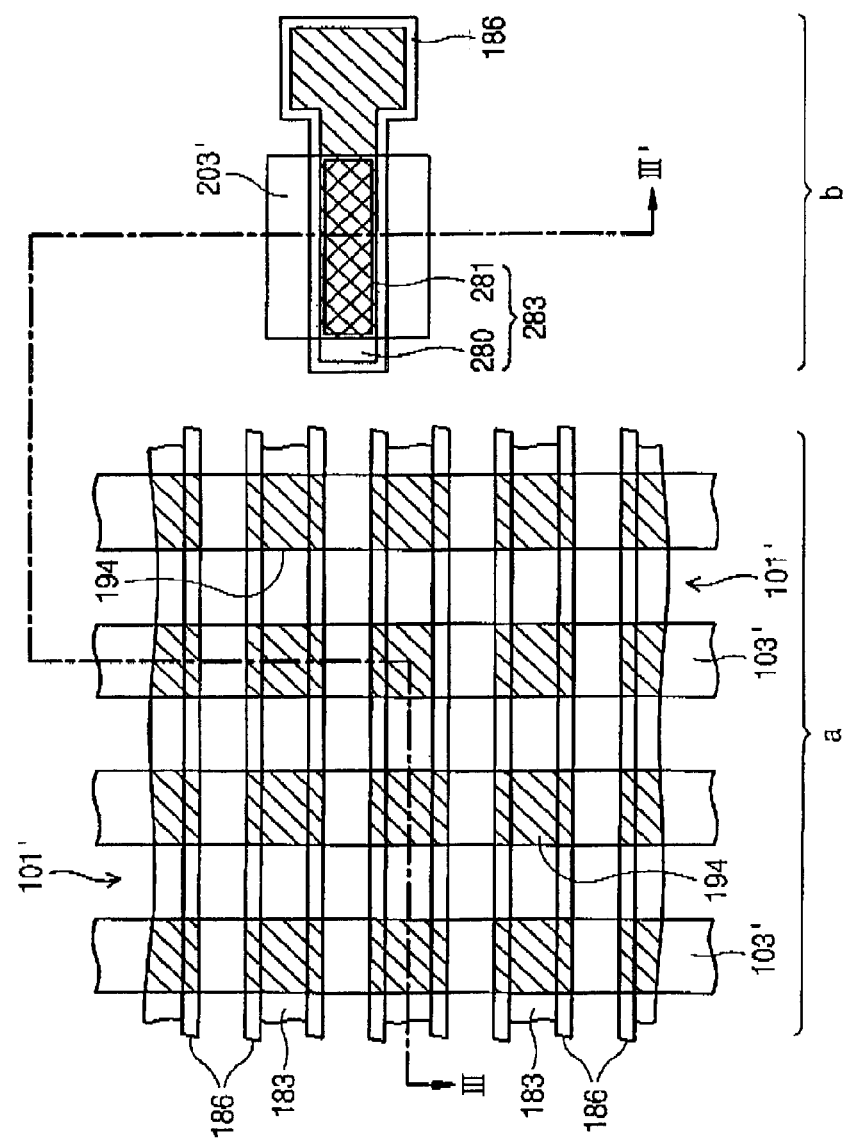
FIG. 15 is a top plan view of a non-volatile memory device according to third and fourth embodiments of the present invention.
Figure 16:
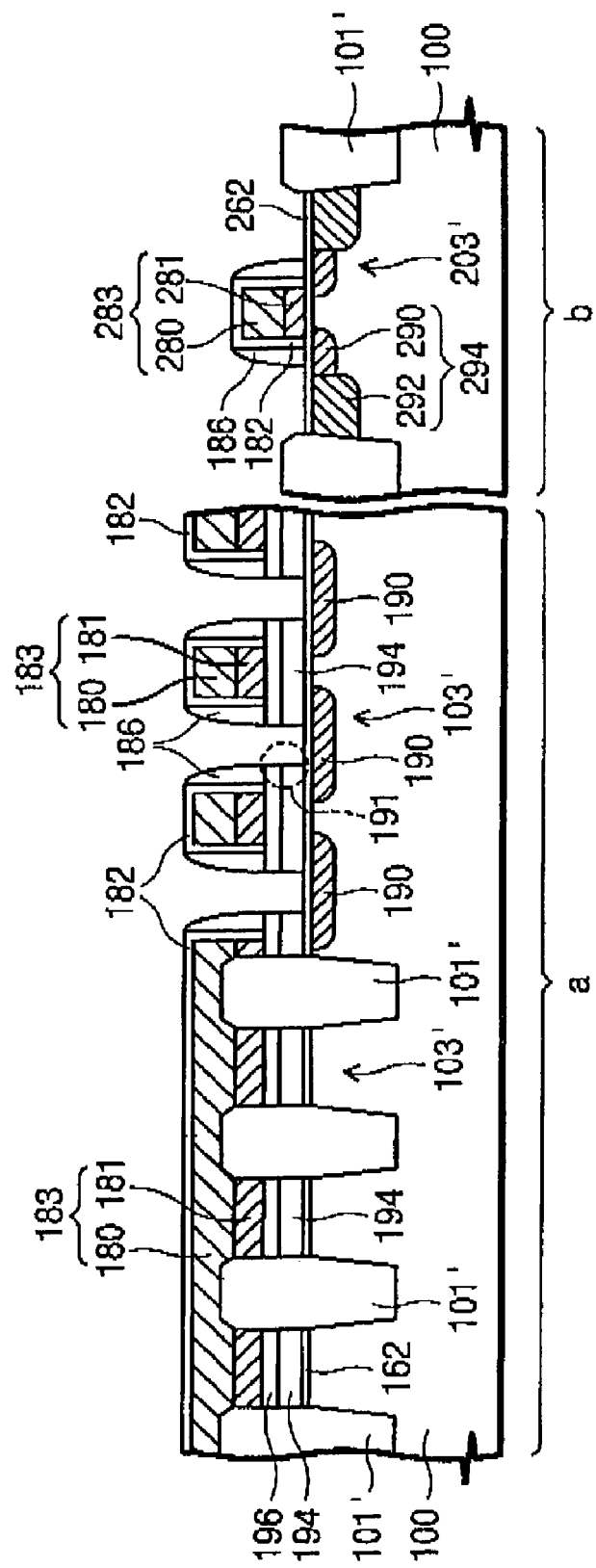
FIG. 16 is a cross-sectional view of a non-volatile memory device according to the third embodiment, taken along a line III–III' of FIG. 15.

FIG. 15 is a top plan view illustrating a non-volatile memory device according to third and fourth embodiments of the present invention, in which reference numerals "a" and "b" denote a cell array region and a peripheral circuit region, respectively. FIG. 16 is a cross-sectional view illustrating a non-volatile memory device according to a third embodiment of the present invention, taken along a line III–III' of FIG. 15.

Referring now to FIG. 15 and FIG. 16, a device isolation layer 101' is formed in a predetermined area of a semiconductor substrate 100 to define a plurality of first active regions 103' in the cell array region "a", and to define a second active region 203' in the peripheral circuit region "b". A plurality of wordlines 183 crossing over the first active regions 103' and the device isolation layer 101' are formed in the cell array region "a". A stack insulating layer intervenes between the wordlines 183 and the first active regions 103', and includes a tunnel oxide layer 162, a charge storage layer 194, and a blocking insulating layer 196 that are sequentially stacked. It is preferable that the tunnel oxide layer 162, the charge storage layer 194, and the blocking insulating layer 196 are made of thermal oxide, silicon nitride, and CVD oxide, respectively. A sidewall of the wordline 183 is covered with a first sidewall spacer 186.

Furthermore, a gate capping oxide layer 182 may intervene between the wordline 183 and the first sidewall spacer 186. Since the charge storage layer 194 and the blocking insulating layer 196 have larger widths than the wordline 183, they have a protruding part 191 that protrudes from the sidewall of the wordline 183. Therefore, although a high electric field is applied between the wordline 183 and the first active region 103' by a program voltage or an erase voltage, an electric field applied to the protruding part 191 is weak. As a result, a leakage current flowing through the blocking insulating layer 196 and the tunnel oxide layer 162 each being formed over and under the protruding part 191 is considerably reduced to improve a soft program characteristic or a data retention characteristic.

The first sidewall spacer 186 covers not only the sidewall of the wordline 183 but also a top surface of the protruding part 191. Furthermore, a second sidewall spacer 188 (see FIG. 19) may cover an outer sidewall of the first sidewall spacer 186, a sidewall of the blocking insulating layer 196, and a sidewall of the charge storage layer. A first impurity diffusion layer 190 is formed in the first active region 103' between the wordlines 183. Therefore, a first cell transistor is formed at an intersection of the wordline 183 and the first active region 103'. In this case, the tunnel oxide layer 152 under the wordline 140 has a uniform thickness. That is, a thick tunnel oxide layer caused by a bird's beak phenomenon is not formed at least under an edge of the wordline 183. Thus, a plurality of first transistors in the cell array region "a" have the equivalent threshold voltage.

In the peripheral circuit region "b", a gate electrode 283 is formed to cross over the second active region 203. A gate insulating layer 262 intervenes between the gate electrode 283 and the second active region 203. A sidewall of the gate electrode 283 is covered with the first sidewall spacer 186. Furthermore, an outer sidewall of the first sidewall spacer 186 may be covered with a second sidewall spacer, as described above. The gate capping oxide layer 182 may intervene between the first sidewall spacer 186 and the gate electrode 283. Dual-structured impurity diffusion layers 294 are formed in the second active region 203' at both sides of the gate electrode 283. The dual-structure impurity diffusion layer 294 includes second and third impurity diffusion layers 290 and 292. As a result, the impurity diffusion layer 294 corresponds to an LDD-type source/drain region, and the second impurity diffusion layer 290 and the third impurity diffusion layer 292 correspond to a lightly doped diffusion layer and a heavily doped impurity diffusion layers, respectively.

A difference between the first and third embodiments is that the device isolation layer 101' is formed using a self-aligned shallow trench technology (S. A. STI). Accordingly, the wordline 183 includes an upper wordline 180 crossing the first active region 103' and a lower wordline 181 intervened between the upper wordline 180 and the first active region 103'. As shown in FIG. 16, the gate electrode 283 may include a lower gate electrode 281 and an upper gate electrode 280.

Figure 17:
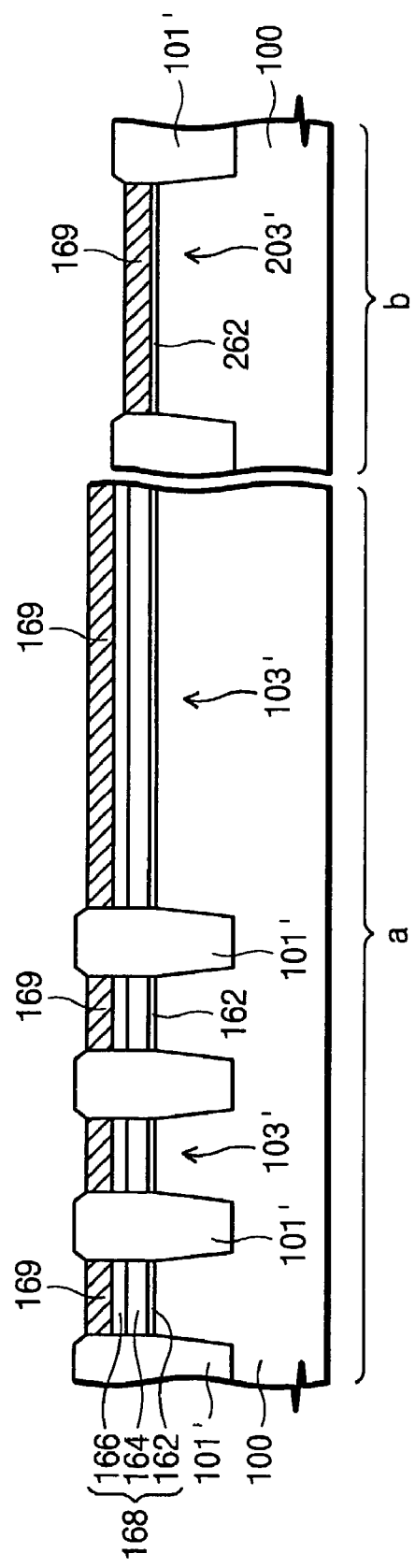
FIG. 17 through FIG. 19 are cross-sectional flow diagrams showing the steps of fabricating the non-volatile memory device according to the third embodiment, taken along the line III–III' of FIG. 15.
Figure 18:
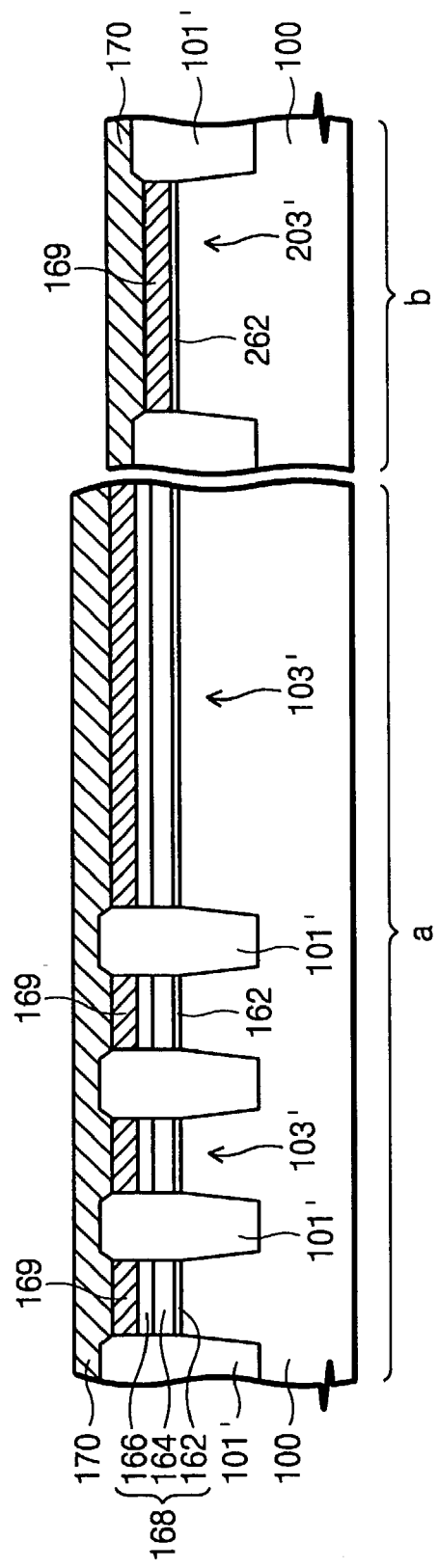
Figure 19:
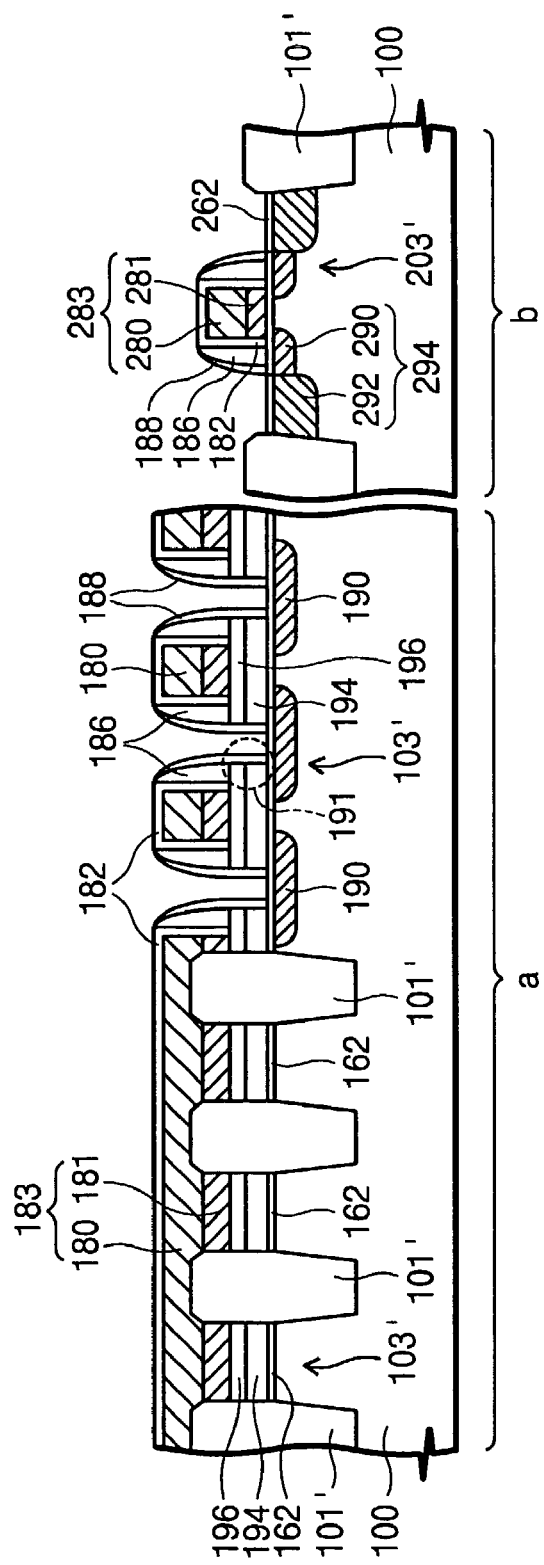

FIG. 17 through FIG. 19 are cross-sectional flow diagrams for explaining the steps of fabricating the non-volatile memory device according to the third embodiment of the present invention, taken along a line III–III' of FIG. 15.

Referring now to FIG. 17, a stack insulating layer 168 is formed on a semiconductor substrate 100. After the stack insulating layer 168 formed in a peripheral circuit region "b" is removed and a gate insulating layer 262 is formed, a lower gate conductive layer 169 and a hard mask layer are formed on an entire surface of the substrate 100. The hard mask layer, the lower gate conductive layer 169, the stack insulating layer 168, and the substrate 100 in a cell array region "a" and the hard mask layer, the lower gate electrode 169, and the substrate 100 are sequentially patterned to form a trench in a predetermined area of the substrate 100. Preferably, the first insulating layer 162 is formed to a thickness of 15 Å–35 Å in order to make a tunneling of charges even in low program and erase voltages. As above-mentioned in first embodiment, the second insulating layer 164 is preferably made of silicon nitride to a thickness of 40 Å–100 Å, and the third insulating layer 166 is preferably made of CVD oxide to a thickness of 40 –Å120 Å. Thereafter, the trench area is filled with an insulating layer to form a device isolation layer 101', and the hard mask layer is removed.

Referring now to FIG. 18, the upper gate conductive layer 170 is formed on an entire surface of a semiconductor substrate 100 where the device isolation layer 101' is formed. The upper gate conductive layer 170 is preferably made of polysilicon, or polycide that is formed by sequentially stacking polysilicon and metal silicide.

Referring now to FIG. 19, the upper gate conductive layer 170 and the lower gate conductive layer 169 are sequentially patterned to form a plurality of wordlines 183 crossing the first active region 103' in the cell array region "a", and to form a gate electrode 283 crossing the second active region 203' in the peripheral circuit region "b". In the same manner as the first embodiment, a first impurity diffusion layer 190 is formed in the first active region 103' between the wordlines 183, and a second impurity diffusion layer 290 is formed in the second active region 203' at both sides of the gate electrode 283. A first sidewall spacer 186 is formed on sidewalls of a wordline 183 and a gate electrode 283. The wordline 183 includes lower and upper wordlines 181 and 180 that are sequentially stacked, and the gate electrode 283 includes lower and upper gate electrodes 281 and 280. Using the sidewall spacer 186 and the wordline 183 in the cell array region "a" as an etch mask, at least the third and second insulating layers 166 and 164 are etched to form third and second insulating layer patterns 196 and 194 between the wordline 183 and each of the active regions 103'.

An edge of the second insulating layer pattern 194 is extended to have a protruding part 191 that protrudes from a sidewall of the wordline 183. The second insulating layer pattern 194 corresponds to a charge storage layer, and the third insulating layer pattern 196 intervened between the wordline 183 and the second insulating layer pattern 194 corresponds to a blocking insulating layer. The first insulating layer 162 intervened between the second insulating layer pattern 194 and the first active region 103' corresponds to a tunnel oxide layer. Following formation of the first sidewall spacer 186, impurities are implanted into the second active region 203' at both sides of the gate electrode 283 in the peripheral circuit region "b" to form a third impurity diffusion layer 292. Thus, a dual-structured impurity diffusion layer 294 is formed in the second active region 203' on either side (both sides) of the gate electrode 283. The third impurity diffusion layer 292 may be formed before or after formation of the second insulating layer pattern 194.

Furthermore, a second sidewall spacer 188 may be formed in the cell array region "a" and the peripheral circuit region "b". The second sidewall spacer 188 covers not only sidewalls of the third and second insulating layer patterns 196 and 194 in the cell array region "a" but also the first sidewall spacer 186 in the peripheral circuit region "b". In this case, the first and second impurity diffusion layers 190 and 290 may be formed following formation of the first sidewall spacer 186. Also, the third impurity diffusion layer 292 may be formed in the second active region 203' on either side (both sides) of the gate electrode 283 following formation of the second sidewall spacer 148.

Figure 20:
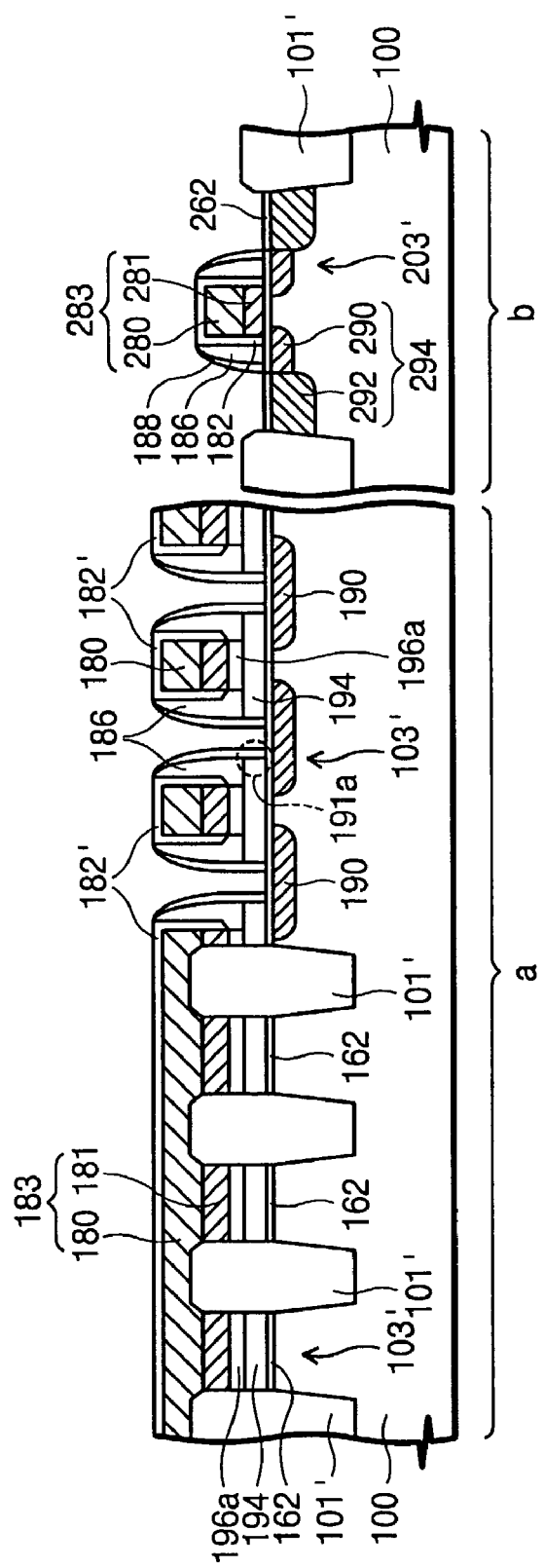
FIG. 20 is a cross-sectional view of a structure according to the fourth embodiment, taken along the line III–III' of FIG. 15.

FIG. 20 is a cross-sectional view illustrating a non-volatile memory device according to a modified version of the second embodiment, taken along a line III–III' of FIG. 15.

Referring now to FIG. 20, in a fourth embodiment of the invention, a device isolation layer is formed using a self-aligned shall trench technology (S. A. STI), like the third embodiment. Steps until formation of the gate conductive layer are identical to those in the foregoing modified version of the first embodiment. Subsequent steps are performed in the same manner as the second embodiment, forming a wordline 183 crossing a first active region 103' in a cell array region "a" of a semiconductor substrate 100 and a gate electrode 283 extended to an upper part of the device isolation layer 101' in the second active region 203' in the peripheral circuit region "b". A gate capping oxide layer 182' may further be formed on sidewalls and top surfaces of wordline 183 and gate electrode 283. A tunnel oxide layer 162, a charge storage layer 194, and a blocking insulating layer 196a are sequentially stacked on the first active region 103' between device isolation layers 101a, and are intervened between the wordline 183 and the first active region 103'. The blocking insulating layer 196a is self-aligned to the wordline 183, so that their widths are identical to each other.

A sidewall of the charge storage layer 194 has a protruding part 191 a that protrudes from a sidewall of the gate electrode. A first sidewall spacer 186 is formed on the sidewall of the wordline 183 and the protruding part 191 a of the charge storage layer 194 in the cell array region "a", and on the sidewall of the gate electrode 283 in the peripheral circuit region "b". Furthermore, the second spacer 188 may be formed to cover the first sidewall spacer 186 and a sidewall of the charge storage layer 194 in the cell array region "a", and the first sidewall spacer 186 in the peripheral circuit region "b". A first impurity diffusion layer 190 is formed in the first active region 103' between the wordlines 183, and a dual-structured impurity diffusion layer 294 is formed in a second active region 203' on either side (both sides) of the gate electrode 283. The dual-structured impurity diffusion layer 294 includes second and third impurity diffusion layers 290 and 292.

According to the present invention, an edge of a charge storage layer is extended to have a protruding part that protrudes from a sidewall of a gate electrode. With a high defect density, edges of a blocking insulating layer and a tunnel oxide layer also protrude from the sidewall of the gate electrode, which results in a conspicuous decrease in a leakage current flowing through defect sites in the edges of the blocking insulating layer and the tunnel oxide layer. Thus, a data retention characteristic can be improved in comparison with the prior art.

Furthermore, the invention makes it possible to lessen deterioration of repeated operation cycle characteristics, and to form a tunnel oxide layer without a bird's beak under the gate electrode. Thus, the threshold voltage distribution range of memory cells can be reduced.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A non-volatile memory device comprising:
a plurality of parallel device isolation layers formed in a predetermined area of a semiconductor substrate to define an active region;
a gate electrode crossing the active region and the device isolation layers adjacent to both sides of the active region; and
a tunnel oxide layer, a charge storage layer, and a blocking insulating layer which are sequentially stacked between the gate electrode and at least the active region, the tunnel oxide layer wider than the blocking insulation layer, wherein the charge storage layer is extended in parallel with the device isolation layer to have a protruding part which protrudes from a sidewall of the gate electrode.

2. The non-volatile memory device of claim 1, wherein the gate electrode includes:
an upper gate electrode crossing the active region and the device isolation layer; and
a lower gate electrode between the upper gate electrode and the active region,
wherein the tunnel oxide layer, the charge storage layer, the blocking insulating layer, and the lower gate electrode are sequentially stacked on the active region between the adjacent device isolation layers.

3. The non-volatile memory device of claim 1, wherein the charge storage layer and the blocking insulating layer are extended in parallel with the gate electrode to cross over the active region and the device isolation layers.

4. The non-volatile memory device of claim 1, wherein the blocking insulating layer is self-aligned to the gate electrode to have the same width as a width of the gate electrode.

5. The non-volatile memory device of claim 4, further comprising a first sidewall spacer which covers a sidewall of the gate electrode and a sidewall of the blocking insulating layer, and is located on the protruding part of the charge storage layer.

6. The non-volatile memory device of claim 5, further comprising a capping oxide layer between the first sidewall spacer and the gate electrode.

7. The non-volatile memory device of claim 5, further comprising a second sidewall spacer covering an outer sidewall of the first sidewall spacer and a sidewall of the charge storage layer.

8. The non-volatile memory device of claim 1, wherein the blocking insulating layer has a protruding part which protrudes from the sidewall of the gate electrode, and has the same width as a width of the charge storage layer.

9. The non-volatile memory device of claim 8, further comprising a first sidewall spacer which covers the sidewall of the gate electrode, and is located on the protruding part of the blocking insulating layer.

10. The non-volatile memory device of claim 9, further comprising a gate capping oxide layer between the gate electrode and the first sidewall spacer.

11. The non-volatile memory device of claim 9, further comprising a second sidewall spacer covering an outer sidewall of the first sidewall spacer, a sidewall of the blocking insulating layer, and a sidewall of the charge storage layer.

12. A non-volatile memory device comprising:
an active region defined in a predetermined area of a semiconductor substrate;
a gate electrode crossing over the active region;
a tunnel oxide layer, a charge storage layer, and a blocking insulating layer which are sequentially stacked between the gate electrode and the active region, wherein the charge storage layer has a protruding part which protrudes from a sidewall of the gate electrode, and wherein the blocking insulation layer is self-aligned to the gate electrode to have the same width as a width of the gate electrode; and
a first sidewall spacer which covers the sidewall of the gate electrode and a sidewall of the blocking insulating layer, and is positioned on the protruding part of the charge storage layer.

13. The non-volatile memory device of claim 12, wherein a width of the charge storage layer is equal to the sum of the width of the gate electrode and widths of the first sidewall spacers covering both sidewalls of the gate electrode.

14. The non-volatile memory device of claim 12, further comprising a gate capping oxide layer between the first sidewall spacer and the gate electrode.

15. The non-volatile memory device of claim 12, further comprising a second sidewall spacer which covers an outer sidewall of the first sidewall spacer and a sidewall of the charge storage layer.

16. The non-volatile memory device of claim 12, wherein the tunnel oxide layer and the blocking insulating layer are made of silicon oxide, and the charge storage layer is made of silicon nitride.

17. A non-volatile memory device with a cell array region and a peripheral circuit region, comprising:
device isolation layers formed in a predetermined area of a semiconductor substrate to define a first active region in the cell array region and a second active region in the peripheral circuit region;
a gate electrode crossing the second active region, the gate electrode including an upper gate electrode crossing over the second active region and the device isolation layer adjacent thereto, the gate electrode including a lower gate electrode between the upper gate electrode and the second active region, wherein the lower gate electrode and upper gate electrode are sequentially stacked on the second active region;
a gate insulating layer between the second active region and the gate electrode;
a plurality of wordlines crossing the first active region, each of the plurality of wordlines including an upper wordline crossing over the first active region and the device isolation layers adjacent to both sides of the first active region and including a lower wordline between the upper wordline and the first active region; and
a stack insulating layer between the wordlines and the first active region, wherein the stack insulating layer and the lower wordline are sequentially stacked on the first active region between the device isolation layers, wherein the stack insulating layer includes a tunnel oxide layer, a charge storage layer, and a blocking insulating layer which are sequentially stacked, and wherein the charge storage layer has a protruding part at both sides of the wordline.

18. A non-volatile memory device with a cell array region and a peripheral circuit region, comprising:
device isolation layers formed in a predetermined area of a semiconductor substrate to define a first active region and a second active region in the cell array region and the peripheral circuit regions, respectively;
a gate electrode crossing the second active region;
a gate insulating layer between the second active region and the gate electrode;
a plurality of wordlines crossing the first active region; and
a stack insulating layer between the wordlines and at least the first active region, wherein the stack insulating layer includes a tunnel oxide layer, a charge storage layer, and a blocking insulating layer which are sequentially stacked, wherein at least the charge storage layer is extended across the wordlines to have a protruding part at both sides of the wordlines, and wherein the blocking insulating layer is self-aligned to the overlying wordline to have the same width as the wordline.

19. The non-volatile memory device of claim 18, further comprising a first sidewall spacer which covers a sidewall of the wordline and a sidewall of the blocking insulating layer, and is located on the protruding part of the charge storage layer.

20. The non-volatile memory device of claim 19, further comprising a second sidewall spacer covering an outer sidewall of the first sidewall spacer and the sidewall of the charge storage layer.

21. A non-volatile memory device comprising:
an active region defined in a predetermined area of a semiconductor substrate;
a gate electrode crossing over the active region; and
a tunnel oxide layer, a charge storage layer, and a blocking insulating layer that are sequentially stacked between the gate electrode and the active region, the tunnel oxide layer wider than the blocking insulation layer, the blocking insulation layer having the same width as the width of the charge storage layer, the charge storage layer and the blocking insulation layer each having a protruding part that protrudes from a sidewall of the gate electrode.

22. The non-volatile memory device of claim 21, further comprising a first sidewall spacer which covers the sidewall of the gate electrode, and is positioned on the protruding part of the blocking insulating layer.

23. The non-volatile memory device of claim 22, wherein the width of the charge storage layer is equal to the sum of the width of the gate electrode and widths of the first sidewall spacers covering the both sidewalls of the gate electrode.

24. The non-volatile memory device of claim 22, further comprising a gate capping oxide layer between the gate electrode and the first sidewall spacer.

25. The non-volatile memory device of claim 22, further comprising a second sidewall spacer covering an outer sidewall of the first sidewall spacer, the sidewall of the blocking insulating layer, and the sidewall of the charge storage layer.

26. A non-volatile memory device having a cell array region and a peripheral circuit region, the non-volatile memory device comprising:
 device isolation layers formed in a semiconductor substrate to define a first active region in the cell array region and a second active region in the peripheral circuit region;
 a first gate electrode crossing the second active region;
 a first sidewall spacer covering a sidewall of the first gate electrode;
 a second sidewall spacer covering an outer sidewall of the first sidewall spacer;
 a second gate electrode extending in a first direction to cross the first active region and the device isolation layers adjacent to both sides of the first active region, the second gate electrode having sidewalls opposite each other in a second direction that is perpendicular to the first direction; and
 a tunnel oxide layer, a charge storage layer, and a blocking insulating layer which are sequentially stacked between the second gate electrode and the first active region, the charge storage layer having a protruding part that protrudes from at least one of the sidewalls of the second gate electrode.

27. The non-volatile memory device of claim 26, further comprising a capping oxide layer between the first sidewall spacer and the first gate electrode.

28. A non-volatile memory device having a cell array region and a peripheral circuit region, the non-volatile memory device comprising:
 device isolation layers formed in a semiconductor substrate to define a first active region in the cell array region and a second active region in the peripheral circuit region;
 a first gate electrode crossing the second active region;
 a first sidewall spacer covering a sidewall of the first gate electrode;
 a second sidewall spacer covering an outer sidewall of the first sidewall spacer;
 a second gate electrode crossing the first active region and the device isolation layers adjacent to both sides of the first active region; and
 a tunnel oxide layer, a charge storage layer, and a blocking insulating layer which are sequentially stacked between the second gate electrode and the first active region, the tunnel oxide layer wider than the blocking insulation layer, the charge storage layer extended in parallel with the device isolation layers and having a protruding part that protrudes from a sidewall of the second gate electrode.

29. The non-volatile memory device of claim 28, wherein the first gate electrode and the second gate electrode comprise a lower gate electrode and an upper gate electrode, respectively.

30. The non-volatile memory device of claim 28, wherein the blocking insulating layer is self-aligned to the second gate electrode and has the same width as the second gate electrode.

31. The non-volatile memory device of claim 30, further comprising a third sidewall spacer covering a sidewall of the second gate electrode and a sidewall of the blocking insulating layer, the third sidewall spacer located on the protruding part of the charge storage layer.

32. The non-volatile memory device of claim 31, further comprising a fourth sidewall spacer covering an outer sidewall of the third sidewall spacer and a sidewall of the charge storage layer.

33. The non-volatile memory device of claim 28, wherein the blocking insulating layer has a protruding part that protrudes from a sidewall of the second gate electrode, and has the same width as the charge storage layer.

34. The non-volatile memory device of claim 33, further comprising a third sidewall spacer covering the sidewalls of the second gate electrode, and is located on the protruding part of the blocking insulating layer.

35. The non-volatile memory device of claim 34, further comprising a fourth sidewall spacer covering an outer sidewall of the third sidewall spacer, a sidewall of the blocking insulating layer, and a sidewall of the charge storage layer.

* * * * *

UNITED STATES PATENT AND TRADEMARK OFFICE
CERTIFICATE OF CORRECTION

PATENT NO. : 7,081,651 B2  
APPLICATION NO. : 10/186153  
DATED : July 25, 2006  
INVENTOR(S) : Jung-Dal Choi et al.

It is certified that error appears in the above-identified patent and that said Letters Patent is hereby corrected as shown below:

Column 2, line 62, the word "nonvolatile" should read -- non-volatile --;  
Column 3, line 15, the word "nonvolatile" should read -- non-volatile --;  
Column 4, line 9, the word "II-II" should read -- II-II' --;  
Column 4, line 13, the word "II-II" should read -- II-II' --;  
Column 4, line 17, the word "II-II" should read -- II-II' --;  
Column 4, line 55, the word "II-II" should read -- II-II' --;  
Column 5, line 56, the word "II-II" should read -- II-II' --;  
Column 10, line 28, the words "40 -Å120 Å." should read -- 40Å-120Å. --.

Signed and Sealed this

Eighteenth Day of August, 2009

David J. Kappos  
*Director of the United States Patent and Trademark Office*